US012500072B2

(12) United States Patent
Leonard, III et al.

(10) Patent No.: US 12,500,072 B2
(45) Date of Patent: Dec. 16, 2025

(54) PLASMA CHAMBER WITH ANCILLARY REACTION CHAMBER

(71) Applicant: RECARBON, INC., Santa Clara, CA (US)

(72) Inventors: George Stephen Leonard, III, San Jose, CA (US); Stefan Andrew McClelland, San Jose, CA (US); John Joseph Rehagen, Sunnyvale, CA (US); Jae Mo Koo, Palo Alto, CA (US)

(73) Assignee: RECARBON, INC., Santa Clara, CA (US)

( * ) Notice: Subject to any disclaimer, the term of this patent is extended or adjusted under 35 U.S.C. 154(b) by 109 days.

(21) Appl. No.: 17/654,577

(22) Filed: Mar. 11, 2022

(65) Prior Publication Data

US 2022/0293400 A1 Sep. 15, 2022

Related U.S. Application Data

(60) Provisional application No. 63/160,300, filed on Mar. 12, 2021.

(51) Int. Cl.
*H01J 37/00* (2006.01)
*H01J 37/32* (2006.01)

(52) U.S. Cl.
CPC .. *H01J 37/32844* (2013.01); *H01J 37/32229* (2013.01); *H01J 37/32467* (2013.01); *H01J 37/32899* (2013.01)

(58) Field of Classification Search
CPC ........... H01J 37/32844; H01J 37/32467; H01J 37/32899; H01J 37/32229; H01J 37/3244
See application file for complete search history.

(56) References Cited

U.S. PATENT DOCUMENTS 6,450,116 B1 9/2002 Noble et al.
9,275,839 B2 3/2016 Chen et al.
(Continued)

FOREIGN PATENT DOCUMENTS

CN 102757032 A 10/2012
CN 210559627 U 5/2020
(Continued)

OTHER PUBLICATIONS

International Search Report and Written Opinion in PCT/US2022/071115 mailed Jun. 6, 2022.
(Continued)

*Primary Examiner* — Tuan T Lam
(74) *Attorney, Agent, or Firm* — Buchalter; Jason W. Croft

(57) ABSTRACT

A plasma reaction system may include a plasma chamber and an ancillary reaction chamber. The plasma chamber may include a plasma chamber inlet for introducing reactant gases into the plasma chamber, plasma chamber walls that form an interior space in which chemical reactions between the reactant gases may occur, a plasma generated within the plasma chamber, a waveguide for directing energy towards the plasma generated within the plasma chamber, and a plasma chamber outlet for carrying first outlet gases from the plasma chamber. The ancillary reaction chamber may include an ancillary reaction chamber inlet configured to obtain the first outlet gases from the plasma chamber, ancillary reaction chamber walls that form an interior space of the ancillary reaction chamber in which second chemical reactions between the outlet gases may occur, and an ancillary reaction chamber outlet for carrying second outlet gases from the ancillary reaction chamber.

20 Claims, 3 Drawing Sheets

(56) References Cited

U.S. PATENT DOCUMENTS

| | | | |
|---|---|---|---|
| 9,691,592 B2 | 6/2017 | Jiang | |
| 10,832,893 B2 | 11/2020 | McClelland et al. | |
| 11,148,116 B2 * | 10/2021 | Xia | B01J 19/1843 |
| 2002/0197416 A1 | 12/2002 | Majewski et al. | |
| 2020/0312629 A1 | 10/2020 | Leonard, III et al. | |
| 2022/0055901 A1 * | 2/2022 | Bell | B01J 7/00 |

FOREIGN PATENT DOCUMENTS

| | | | |
|---|---|---|---|
| JP | 2013534207 | A | 9/2013 |
| KR | 20010110795 | A | 12/2001 |
| WO | 2012023858 | A1 | 2/2012 |
| WO | 2020115473 | A1 | 6/2020 |

OTHER PUBLICATIONS

Examination Report for Australian Patent Application No. 2022234467 dated Oct. 24, 2024, 5 pgs.

Office Action for Japanese Patent Application No. 2023-549917 dated Oct. 8, 2024, 8 pgs with translations.

Office Action in Canadian Patent Application No. 3,212,953 mailed Sep. 13, 2024.

International Preliminary Report on Patentability for International Application No. PCT/US2022/071115, mailed Sep. 21, 2023.

Extended European Search Report of European Patent Application No. 22768240.8 mailed Dec. 16, 2024, 9 pgs.

Office Action for Korean Patent Application No. 10-2023-7030612 mailed Dec. 29, 2024, 10 pages with machine translations.

Decision of Rejection of Japanese Patent Application No. 2023-549917 mailed Jul. 22, 2025, 8 pages with translations.

* cited by examiner

PLASMA CHAMBER WITH ANCILLARY REACTION CHAMBER

CROSS-REFERENCE TO RELATED APPLICATION

This application claims the benefit of U.S. Patent Application Ser. No. 63/160,300, filed on Mar. 12, 2021; the disclosure of which is incorporated herein by reference in its entirety.

FIELD OF THE INVENTION

The present disclosure generally relates to a plasma reaction system with a plasma chamber and one or more ancillary reaction chambers.

BACKGROUND

Gas reactions may be affected within a reactor chamber of a gas reactor configured for inlet and outlet flow of gases. The inlet flow of gases may include one or more gas reactants, and the outlet flow may include one or more gas products generated based on the gas reactants included in the inlet flow. In some situations, gas reactions may be exothermic reactions that produce heat during the reaction process, while in other situations, the gas reactions may be endothermic reactions that use heat input to drive the reaction process. As such, the reactor chamber in which the gas reactions occur may reach high temperatures during operation of the gas reactor.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

A plasma system used to process or reform gas may include at least one waveguide, one or more gas inlets and outlets, and at least one plasma chamber that is typically cylindrical, transparent to electromagnetic waves, and impermeable to gas. Gas may be injected into the plasma chamber where it interacts with an energy source to form plasma. The amount of gas that can be processed in a plasma chamber may be dependent on the power of the energy source. Specifically, high flow rates above a critical value can cause the plasma in a plasma chamber to extinguish or operate in a suboptimal mode.

According to an aspect of an embodiment, a plasma reaction system may include a plasma chamber and an ancillary reaction chamber. The plasma chamber may include a plasma chamber inlet for introducing reactant gases into the plasma chamber, plasma chamber walls that form an interior space in which chemical reactions between the reactant gases may occur, a plasma generated within the plasma chamber, a waveguide for directing energy towards the plasma generated within the plasma chamber, and a plasma chamber outlet for carrying first outlet gases from the plasma chamber. The ancillary reaction chamber may include an ancillary reaction chamber inlet configured to obtain the first outlet gases from the plasma chamber, ancillary reaction chamber walls that form an interior space of the ancillary reaction chamber in which second chemical reactions between the outlet gases may occur, and an ancillary reaction chamber outlet for carrying second outlet gases from the ancillary reaction chamber.

The object and advantages of the embodiments will be realized and achieved at least by the elements, features, and combinations particularly pointed out in the claims. It is to be understood that both the foregoing general description and the following detailed description are explanatory and are not restrictive of the invention, as claimed.

BRIEF DESCRIPTION OF THE DRAWINGS

Example embodiments will be described and explained with additional specificity and detail through the accompanying drawings in which.

DETAILED DESCRIPTION

A plasma reaction system according to the present disclosure may allow for processing or reformation (i.e., rearrangement of a molecular structure of hydrocarbons included in a gas) of gas by injecting unreacted gas after a plasma chamber included in the plasma reaction system. The unreacted gas injected after the plasma chamber may react with "waste" residual energy contained in the processed stream from the plasma chamber. This is accomplished with one or more inlets designed to introduce the additional gas stream into the post-plasma chamber stream and effect mixing between the two gas streams. In cases where the reformation of the post-plasma stream is exothermic, the temperature of the mixed stream may be high enough for reformation to occur.

After mixing, an ancillary reaction chamber may provide sufficient residence time for reformation to occur in the mixed-gas stream. Additionally or alternatively, the ancillary reaction chamber may be recuperatively or externally cooled. The gas stream leaves the ancillary reaction chamber and flows into piping or tubing for further processing or storage of the gases.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
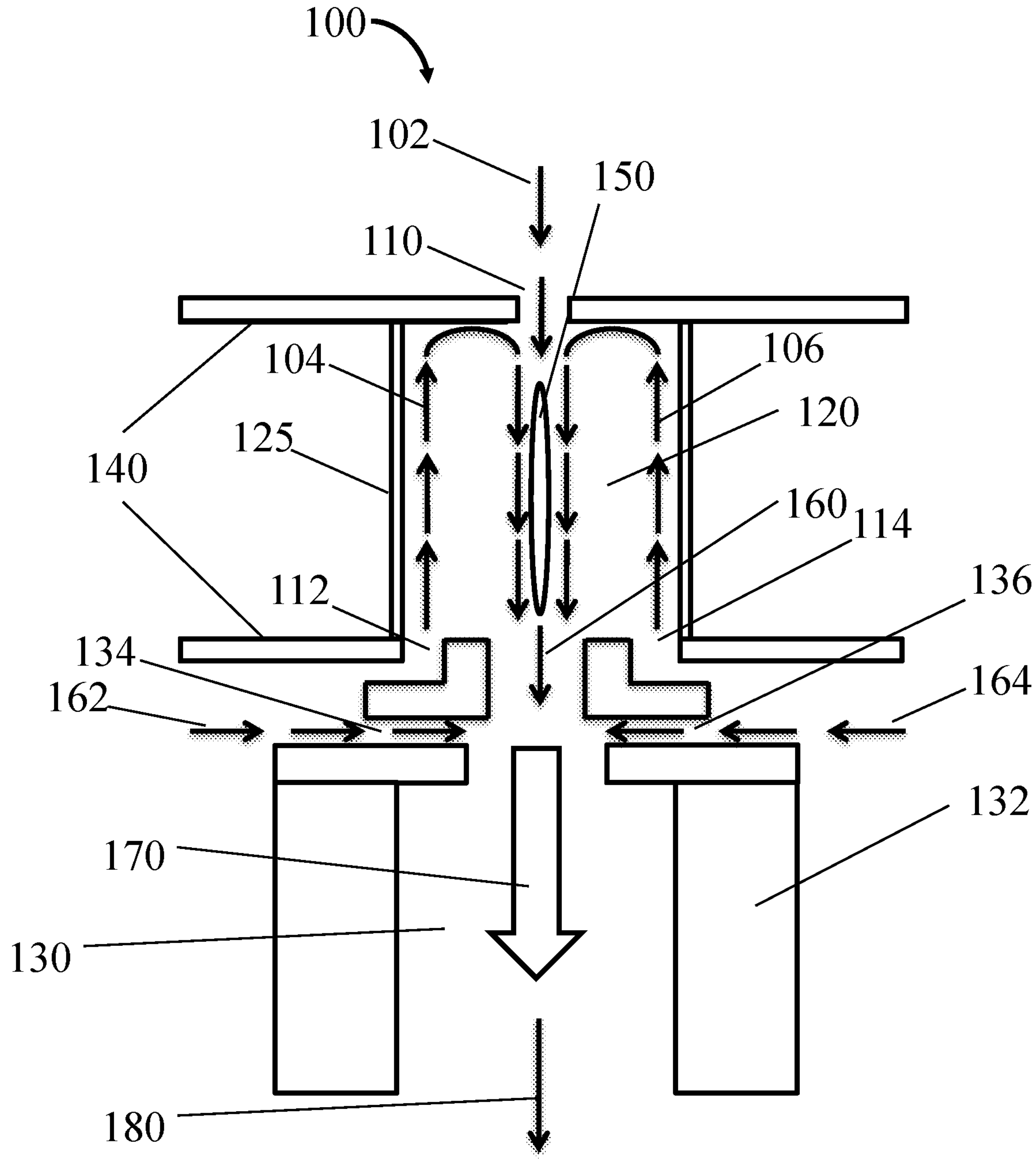
FIG. 1 is a diagram of an example embodiment of a plasma reaction system that includes a plasma chamber and an ancillary reaction chamber according to at least one embodiment of the present disclosure.

FIG. 1 illustrates a cross-sectional view of an example embodiment of a plasma reaction system 100 that includes a plasma chamber 120 and an ancillary reaction chamber 130 according to at least one embodiment of the present disclosure. The plasma chamber 120 may include any number of inlets, including a first inlet 110 and a second inlet 112 through which one or more gases 102 may flow to enter the plasma chamber 120. In some embodiments, the first inlet 110 and the second inlet 112 may be positioned on opposite or substantially opposite sides of the plasma chamber 120 such that a gas flow corresponding to the first inlet 110 and a gas flow corresponding to the second inlet 112 generate forward and reverse vortex arrangements within the plasma chamber 120 that facilitate mixing and reaction of the gases 102 within the plasma chamber 120. In some embodiments, the first inlet 110 and/or the second inlet 112 may be positioned along any surface or other part of the plasma chamber 120 and oriented in any direction to facilitate the flow of the gases 102 into the plasma chamber 120 with different vortex arrangements between the first inlet 110 and the second inlet 112. For example, the first inlet 110 may be positioned on a top surface of the plasma chamber 120 such that the gases 102 enter from the top of the plasma chamber 120, while the second inlet 112 may be positioned on a bottom surface of the plasma chamber 120 such that the gases 102 enter from the bottom of the plasma chamber 120 as illustrated in FIG. 1. As another example, the first inlet 110 and the second inlet 112 may both be along a lateral surface of the plasma chamber 120 with the first inlet 110 and the second inlet 112 being positioned opposite or substantially opposite with respect to each other. In some embodiments, the plasma chamber 120 includes one of the first inlet 110, or the second inlet 112.

More than one inlet may be oriented in a particular direction such that the forward vortex arrangement (i.e., corresponding to the first inlet 110) and/or the reverse vortex arrangement (i.e., corresponding to the second inlet 112) include multiple inlet ports. As illustrated in FIG. 1, for example, the reverse vortex arrangement may be formed by the gases 102 flowing through the second inlet 112 and/or a third inlet 114 that is oriented in the same or a similar flow direction as the second inlet 112. Additionally or alternatively, the forward vortex arrangement may include more inlet ports than the first inlet 110, such as one or more inlet ports adjacent to the first inlet 110. In these and other embodiments, the gases 102 entering the plasma chamber 120 via the multiple inlet ports contributing to the forward and/or the reverse vortex arrangements may or may not mix together to form a single gas stream moving in the same direction. As illustrated in FIG. 1, the gases 102 flowing through the second inlet 112 and the third inlet 114 may form gas flow streams 104 and 106, respectively, in which the gas flow streams 104, 106 enter the plasma chamber 120 as discrete streams that mix within the plasma chamber 120 such as after being redirected by the top surface of the plasma chamber 120.

One or more chamber walls 125 may enclose the plasma chamber 120 and demarcate an interior space of the plasma chamber 120 in which chemical reactions between gases flowing into the plasma chamber 120 may occur. In some embodiments, the chamber walls 125 may be opaque to gases, inert with respect to chemical reactions that occur within the plasma chamber 120, have a high melting temperature, and/or include a low coefficient of thermal expansion. For example, the chamber walls 125 may be composed of quartz, boron nitride, aluminum, ceramics, silicon carbide, tungsten, molybdenum, any other refractory materials, or a mixture thereof. Additionally or alternatively, the chamber walls 125 may be made of a radiofrequency-transparent material that allows energy directed by one or more waveguides 140 to feed a plasma 150 inside the plasma chamber 120. As such, energy from a microwave, electricity, or other source may be directed through the chamber walls 125 by the waveguides 140 to supply energy for the plasma 150 and the plasma chamber 120.

In these and other embodiments, an average temperature of the plasma chamber 120 may generally range from approximately 1,000 Kelvin (K) to approximately 3,500 K, while a peak temperature of the plasma 150 may reach approximately 50,000 K or higher. The temperature at particular locations within the plasma chamber 120 (e.g., in the center of the plasma chamber 120) may exceed the melting point of the chamber walls 125 and/or the waveguides 140 in some instances. Because the forward vortex arrangement and/or the reverse vortex arrangement of the gases 102 may provide an insulating effect, however, the chamber walls 125 and/or the waveguides 140 may not reach their respective melting points despite the temperature at particular locations of the plasma chamber 120 exceeding those melting points.

The gases 102 in the plasma chamber 120 may include reactant gases involved in chemical reactions relating to natural gas reformation, hydrocarbon generation, reactant combustion, or any other chemical reactions that may be facilitated in a high-temperature reaction environment provided by the plasma chamber 120 in which heat from the plasma 150 may provide sufficient energy to break molecular bonds and/or initiate particular chemical reactions. An outlet gas stream 160 may include chemical products formed by the chemical reactions that occur in the plasma chamber 120 and unreacted reactants included in the gases 102 that entered the plasma chamber 120.

The outlet gas stream 160 may be mixed with one or more ancillary reaction chamber gas flows 162, 164 to form an ancillary reaction chamber inlet flow 170. In some embodiments, the ancillary reaction chamber gas flows 162, 164 may include the same or similar gases as the gases 102 injected into the plasma chamber 120. Additionally or alternatively, the ancillary reaction chamber gas flows 162, 164 may include reactants that were not present in the gases 102 and/or materials that facilitate the occurrence of one or more chemical reactions in the ancillary reaction chamber 130. For example, waste gases and/or liquids from related chemical processes or other plasma reactors may be included in the ancillary reaction chamber gas flows 162, 164 to increase a waste-to-product reformation ratio of the waste gases and/or liquids. Further, waste-to-energy reformation may be improved by including waste in the ancillary reaction chamber gas flows 162, 164.

As another example, oxidizer gases, such as air, oxygen, nitric oxide, etc., may be included in the ancillary reaction chamber gas flows 162, 164 to drive particular chemical reactions and facilitate generation of particular chemical products. By including an ancillary reaction chamber 130 that obtains the outlet gas stream 160 and various other gases, a degree of reaction of one or more chemical reactants may be increased to increase the efficiency of the plasma reaction system 100. Additionally or alternatively, including the ancillary reaction chamber 130 in the plasma reaction system 100 may allow for a smaller plasma chamber 120 because the ancillary reaction chamber 130 may increase a conversion rate of chemical reactants. In these and other embodiments, the ancillary reaction chamber gas flows 162, 164 may include a total flowrate ranging from approximately 50% up to approximately 5000% of the flowrate of the outlet gas stream 160 exiting the plasma chamber 120 to provide gases and/or liquids for chemical reactions to take place in the ancillary reaction chamber 130.

The ancillary reaction chamber gas flows 162, 164 may be directed via one or more ancillary reaction chamber inlets 134, 136 to mix with the outlet gas stream 160 of the plasma chamber 120. In some embodiments, the ancillary reaction chamber inlets 134, 136 may be oriented at approximately 90° relative to the outlet gas stream 160 such that the ancillary reaction chamber gas flows 162, 164 are approximately perpendicular to the outlet gas stream 160. Additionally or alternatively, the ancillary reaction chamber inlets 134, 136 may be oriented at approximately at an angle ranging from approximately 90° (i.e., perpendicular) to approximately 180° (i.e., countercurrent) relative to the outlet gas stream 160. Additionally or alternatively, a number of ancillary reaction chamber inlets and/or an orientation of each ancillary reaction chamber inlet may differ from the two ancillary reaction chamber inlets 134, 136 and the two ancillary reaction chamber gas flows 162, 164 aimed at the same or similar orientations relative to the outlet gas stream 160 as illustrated in FIG. 1. For example, a single ancillary reaction chamber inlet aimed at 180° relative to the outlet gas stream 160 may be used. As another example, three ancillary reaction chamber inlets aimed at varying angles relative to the outlet gas stream 160 may be used. In these and other embodiments, a size and/or a number of ancillary reaction chamber inlets may be set based on a desired flowrate through the plasma chamber 120 and/or the ancillary reaction chamber 130.

The ancillary reaction chamber inlet flow 170 may be directed towards the ancillary reaction chamber 130 for further processing of one or more of the gases included in the ancillary reaction chamber inlet flow 170. In some embodiments, one or more walls 132 of the ancillary reaction chamber 130 may be made of a material that has a high thermal resistance and/or a low coefficient of thermal expansion. For example, the walls 132 may be made of carbon steel or other carbon composites, a nickel alloy, aerospace-grade aluminum, titanium, quartz, ceramics, tungsten, molybdenum, or any other material, including any refractory materials.

The gases included in the ancillary reaction chamber inlet flow 170 may react in the ancillary reaction chamber 130 to yield one or more chemical products. The chemical products yielded by the chemical reactions in the ancillary reaction chamber 130 may include the same chemical products yielded by chemical reactions that occurred in the plasma chamber 120. Additionally or alternatively, the chemical products formed in the ancillary reaction chamber 130 may include various chemicals that are not formed in the plasma chamber 120 based on different chemical reactions facilitated by materials included in the ancillary reaction chamber gas flows 162, 164 that were not present in the gases 102 that entered the plasma chamber 120.

In these and other embodiments, the chemical reactions occurring in the ancillary reaction chamber 130 may be facilitated by heat carried over from the plasma chamber 120. As such, the ancillary reaction chamber 130 may not include any plasma, and energy sources for heating the plasma 150 may not be directed towards the ancillary reaction chamber 130. The absence of plasma and/or directed energy sources may cause the ancillary reaction chamber 130 to operate at lower temperatures than the plasma chamber 120, and the ancillary reaction chamber 130 may include a larger volume and/or operate at a same or different pressure (e.g., higher or lower) than the plasma chamber 120 to facilitate the occurrence of the chemical reactions. Additionally or alternatively, the ancillary reaction chamber 130 may be made of a less heat-resistant material than the plasma chamber 120 because the ancillary reaction chamber 130 may operate at lower temperatures than the plasma chamber 120. For example, the plasma chamber 120 may be composed of an aerospace-grade aluminum, while the ancillary reaction chamber 130 may be composed of a molybdenum metal.

In some embodiments, the chemical products formed during chemical reactions occurring in the ancillary reaction chamber 130, any unreacted chemical reactants, and any other gases included in the ancillary reaction chamber 130 may be directed out of the ancillary reaction chamber 130 in an outlet gas flow 180. The outlet gas flow 180 may be sent to an ancillary reactor unit of the plasma reaction system 100, such as a scrubber, a pressure-swing adsorption unit, an amine unit, and/or a compressor.

Additionally or alternatively, the outlet gas flow 180 may be sent to a second-stage ancillary reaction chamber for further processing of the products, unreacted chemicals, and/or any other gases included in the outlet gas flow 180.

Figure 2:
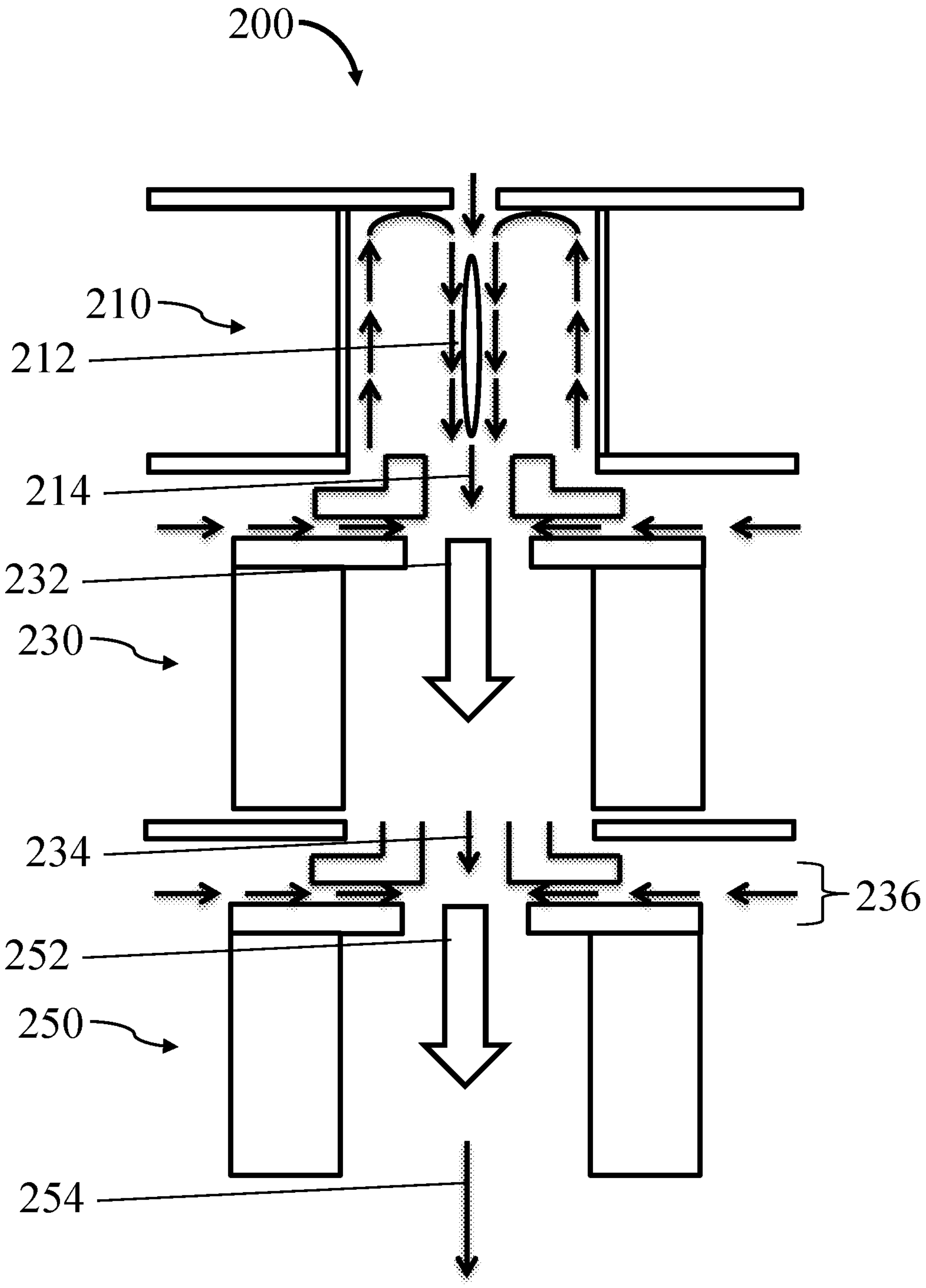
FIG. 2 is a diagram of an example embodiment of a plasma reaction system that includes two ancillary reaction chambers connected in series according to at least one embodiment of the present disclosure.

FIG. 2 is a diagram of an example embodiment of a plasma reaction system 200 that includes a plasma chamber 210 connected with two or more ancillary reaction chambers, such as a first ancillary reaction chamber 230 and a second ancillary reaction chamber 250, in series according to at least one embodiment of the present disclosure. In some embodiments, the plasma chamber 210 may be the same as or similar to the plasma chamber 120 as described in relation to FIG. 1. As such, the plasma chamber 210 may be configured to obtain one or more inlet flows in which each inlet flow includes one or more gases and a particular vortex arrangement. Additionally or alternatively, the plasma chamber 210 may include a plasma that is heated by an energy source, such as a microwave source or an electricity source. In these and other embodiments, the first ancillary reaction chamber 230 may be the same as or similar to the ancillary reaction chamber 130 as described in relation to FIG. 1. As such, the first ancillary reaction chamber 230 may have a size or volume greater than a size or volume of the plasma chamber 210 and/or may operate at a pressure the same as or different than a pressure of the plasma chamber 210.

The second ancillary reaction chamber 250 may be connected to the first ancillary reaction chamber 230 by having an outlet flow 234 of the first ancillary reaction chamber 230 mix with one or more first ancillary reaction chamber gas flows 236 and feed into the second ancillary reaction chamber 250 as a second ancillary reaction inlet flow 252. In some embodiments, the second ancillary reaction chamber 250 may not be connected to a heat source, such as a plasma 212 used to heat the plasma chamber 210. As such, chemical reactions that occur in the second ancillary reaction chamber 250 between gases included in the second ancillary reaction chamber inlet flow 252 may be facilitated by heat from the first ancillary reaction chamber 230, which may be received by the second ancillary reaction chamber 250 along with the gases in the outlet flow 234 of the first ancillary reaction chamber 230.

In these and other embodiments, a temperature of the second ancillary reaction chamber 250 may be less than the temperature of the first ancillary reaction chamber 230. As such, the second ancillary reaction chamber 250 may be made of a material that is less heat resistive and/or include a greater coefficient of thermal expansion than a material used for the first ancillary reaction chamber 230 and/or the plasma chamber 210. Additionally or alternatively, the second ancillary reaction chamber 250 may include a greater volume and/or operate at a same or different pressure than the first ancillary reaction chamber 230 to facilitate chemical reactions that occur in the second ancillary reaction chamber 250.

In some embodiments, an outlet flow 254 of the second ancillary reaction chamber 250 may be sent to an ancillary reactor unit of the plasma reaction system 100, such as a scrubber, a pressure-swing adsorption unit, an amine unit, and/or a compressor, for further processing of the gases included in the outlet flow 254. The outlet flow 254 may be directed towards one or more additional ancillary reaction chambers, such as a third ancillary reaction chamber in series, a third and a fourth ancillary reaction chamber in series, etc. In these and other embodiments, an operating temperature of each subsequent ancillary reaction chamber in the series of ancillary reaction chambers may be less than the operating temperature of the previous ancillary reaction chamber in the series. As such, each subsequent ancillary reaction chamber may have a greater size and/or volume and/or a same or different pressure than the previous ancillary reaction chamber in the series.

In some embodiments, the outlet flow 254 of the second ancillary reaction chamber, the outlet flow 234 of the first ancillary reaction chamber 230, and/or an outlet flow 214 of the plasma chamber 210 may be directed towards one or more ancillary reaction chambers that are configured in parallel with respect to one another.

Figure 3:
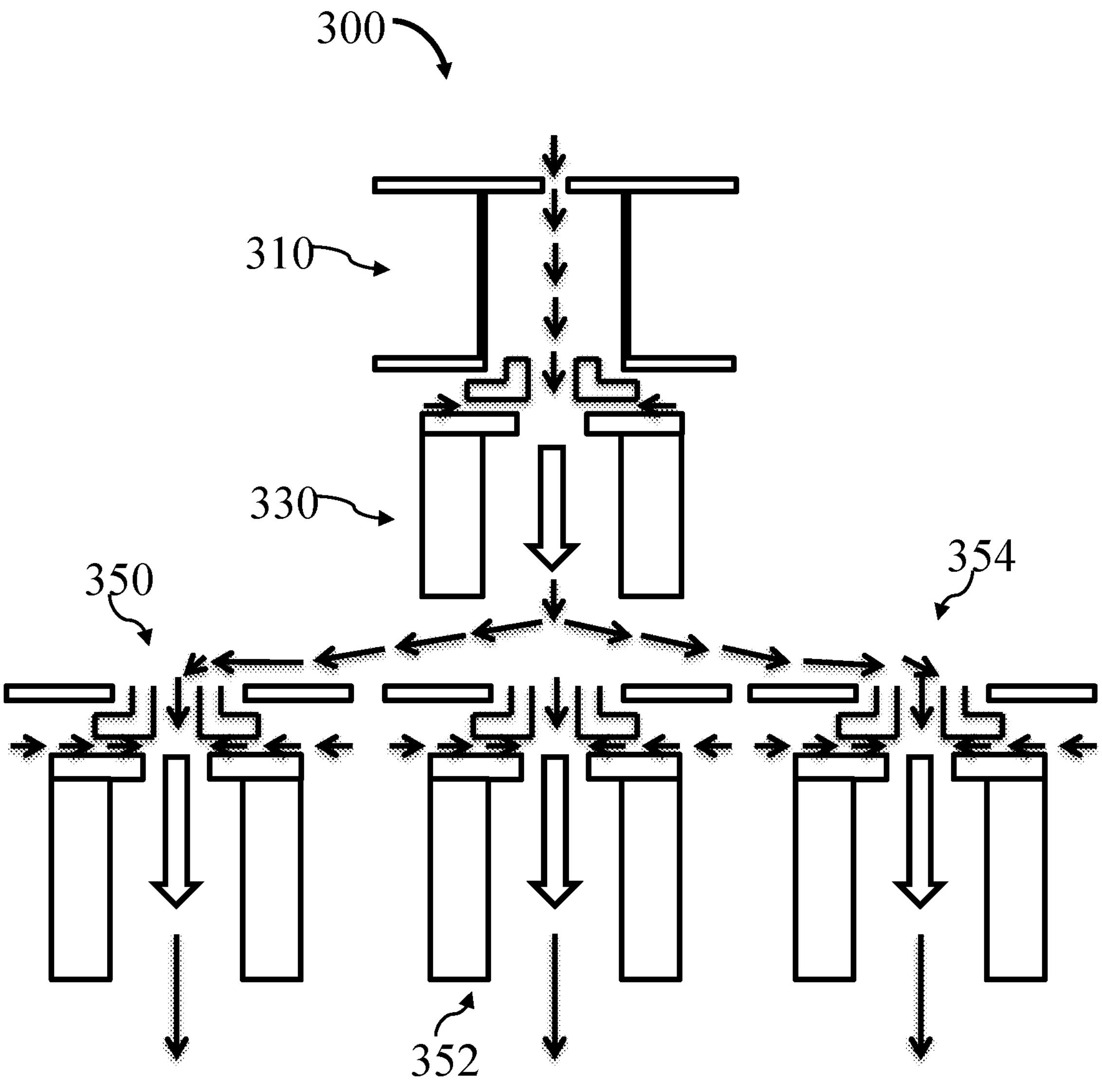
FIG. 3 is a diagram of an example embodiment of a plasma reaction system that includes four ancillary reaction chambers in which one or more ancillary reaction chambers are connected in parallel according to at least one embodiment of the present disclosure.

FIG. 3 is a diagram of an example embodiment of a plasma reaction system 300 that includes a plasma chamber 310 that is connected to a first ancillary reaction chamber 330, and the first ancillary reaction chamber 330 is connected to a second ancillary reaction chamber 350, a third ancillary reaction chamber 352, and a fourth ancillary reaction chamber 354 that are each connected in parallel with one another according to at least one embodiment of the present disclosure. Although the plasma reaction system 300 is illustrated as having the first ancillary reaction chamber 330 in series before the second ancillary reaction chamber 350, the third ancillary reaction chamber 352, and the fourth ancillary reaction chamber 354 in parallel, an outlet flow of the plasma chamber 310 may first be obtained by the first ancillary reaction chamber 330, the second ancillary reaction chamber 350, the third ancillary reaction chamber 352, and/or the fourth ancillary reaction chamber 354 in parallel in a single serial stage. Additionally or alternatively, one or more ancillary reaction chambers may be configured in parallel with each other in a first serial stage with one or more ancillary reaction chambers configured in parallel in a second serial stage after the first serial stage such that any number of serial stages with any number of ancillary reaction chambers configured in parallel in each serial stage is contemplated. Additionally or alternatively, each ancillary reaction chamber that is configured in parallel in a particular serial stage may be simultaneously connected to one or more ancillary reaction chambers in a subsequent serial stage and disconnected from one or more other ancillary reaction chambers in the same subsequent serial stage. In these and other embodiments, various ancillary reactor units may be inserted between one or more of the ancillary reaction chambers included in a chemical process involving the plasma reaction system 300. For example, a non-plasma heat source may be inserted between two serial stages to provide supplemental heat energy to one or more of the ancillary reaction chambers. As another example, an integrated reformer, a pressure-swing adsorption unit, an air separation unit, and/or any other ancillary reactor units may be implemented to facilitate addition and/or removal of materials from the chemical process.

In these and other embodiments, ancillary reaction chambers configured in parallel may receive gases flowing at the same or similar flow rates with the same or similar compositions. Consequently, the ancillary reaction chambers configured in parallel may operate at the same or similar temperatures and include the same or similar volumes and/or operating pressures. Additionally or alternatively, one or more of the ancillary reaction chambers configured in parallel in a particular serial stage may receive gases at a flow rate and/or composition different from the gases received by other ancillary reaction chambers in the same particular serial stage. For example, a first pipe directing gases to a first ancillary reaction chamber of a particular serial stage may include a greater diameter than a second pipe directing gases to a second ancillary reaction chamber of the particular serial stage such that the first ancillary reaction chamber receives a greater flowrate of gases than the second ancillary reaction chamber.

Terms used in the present disclosure and especially in the appended claims (e.g., bodies of the appended claims) are generally intended as "open terms" (e.g., the term "including" should be interpreted as "including, but not limited to.").

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is expressly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase preceding two or more alternative terms, whether in the description, claims, or drawings, should be understood to contemplate the possibilities of including one of the terms, either of the terms, or both of the terms. For example, the phrase "A or B" should be understood to include the possibilities of "A" or "B" or "A and B."

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A plasma reaction system, comprising:

a plasma chamber that includes:

one or more plasma chamber inlets for introducing one or more reactant gases into the plasma chamber;

one or more plasma chamber walls that form an interior space of the plasma chamber, one or more first chemical reactions between the reactant gases occurring within the interior space of the plasma chamber;

a plasma generated within the plasma chamber;

a waveguide for directing energy towards the plasma generated within the plasma chamber; and a plasma chamber outlet for carrying one or more first outlet gases from the plasma chamber; and an ancillary reaction chamber that includes:

an ancillary reaction chamber inlet configured to obtain the first outlet gases from the plasma chamber and one or more gas flows, the first outlet gases from the plasma chamber and the one or more gas flows to form an ancillary reaction chamber inlet flow;

one or more ancillary reaction chamber walls that form an interior space of the ancillary reaction chamber, the ancillary reaction chamber inlet to provide the ancillary reaction chamber inlet flow to the interior space of ancillary reaction chamber where one or more second chemical reactions between the ancillary reaction chamber inlet flow are to occur within the interior space of the ancillary reaction chamber; and an ancillary reaction chamber outlet for carrying one or more second outlet gases from the ancillary reaction chamber.

2. The plasma reaction system of claim 1, wherein a volume of the plasma chamber is less than a volume of the ancillary reaction chamber.

3. The plasma reaction system of claim 1, wherein the ancillary reaction chamber does not include a heat source, heat for the second chemical reactions occurring in the interior space of the ancillary reaction chamber being provided by residual heat corresponding to the first outlet gases.

4. The plasma reaction system of claim 1, wherein:

the plasma chamber walls are composed of a first material; and the ancillary reaction chamber walls are composed of a second material.

5. The plasma reaction system of claim 4, wherein the first material, or the second material, or both the first material and the second material, are selected based, at least in part, on at least one of a coefficient of thermal expansion or a thermal resistance.

6. The plasma reaction system of claim 4, wherein:

the first material includes at least one of: quartz, boron nitride, aluminum, ceramic, silicon carbide, tungsten, and molybdenum; and the second material includes at least one of: carbon steel, nickel alloy, aerospace-grade aluminum, titanium, ceramic, quartz, tungsten, and molybdenum.

7. The plasma reaction system of claim 1, wherein the ancillary reaction chamber further comprises one or more auxiliary chamber inlets, each of the auxiliary chamber inlets being configured to introduce to the ancillary reaction chamber at least one of: one or more of the reactant gases included in the plasma chamber inlet and a waste gas.

8. The plasma reaction system of claim 1, further comprising a second ancillary reaction chamber connected to the ancillary reaction chamber in series, the second ancillary reaction chamber being configured to obtain the second outlet gases from the ancillary reaction chamber and output one or more third outlet gases.

9. The plasma reaction system of claim 1, further comprising a second ancillary reaction chamber connected to the plasma chamber in parallel with the ancillary reaction chamber such that the first outlet gases from the plasma chamber are divided into a first parallel inlet stream directed towards the ancillary reaction chamber and a second parallel inlet stream directed towards the second ancillary reaction chamber.

10. The plasma reaction system of claim 9, wherein the first parallel inlet stream includes a greater flowrate than the second parallel inlet stream.

11. The plasma reaction system of claim 1, wherein the second outlet gases from the ancillary reaction chamber are directed towards one or more ancillary reactor units for processing of the second outlet gases.

12. An ancillary reaction chamber, comprising:

an ancillary reaction chamber inlet configured to obtain one or more gases output by a plasma chamber;

one or more auxiliary chamber inlets, each of the one or more auxiliary chamber inlets being configured to introduce to the ancillary reaction chamber at least one of: one or more reactant gases input into the plasma chamber, or a waste gas, at least one of the one or more auxiliary chamber inlets being configured to directly introduce an oxidizer gas to the ancillary reaction chamber, an ancillary reaction chamber inlet flow being formed from a gas output by the plasma chamber and any gas from the one or more auxiliary chamber inlets;

one or more ancillary reaction chamber walls that form an interior space of the ancillary reaction chamber, one or more chemical reactions using the ancillary reaction chamber inlet flow occurring within the interior space of the ancillary reaction chamber; and an ancillary reaction chamber outlet for carrying one or more outlet gases from the ancillary reaction chamber.

13. The ancillary reaction chamber of claim 12, further comprising a second ancillary reaction chamber connected to the ancillary reaction chamber in series, the second ancillary reaction chamber being configured to obtain the outlet gases from the ancillary reaction chamber and output one or more second outlet gases.

14. The ancillary reaction chamber of claim 12, further comprising a second ancillary reaction chamber connected to the plasma chamber in parallel with the ancillary reaction chamber such that the outlet gases from the plasma chamber are divided into a first parallel inlet stream directed towards the ancillary reaction chamber and a second parallel inlet stream directed towards the second ancillary reaction chamber.

15. The ancillary reaction chamber of claim 12, wherein the ancillary reaction chamber does not include a heat source, heat for the chemical reactions occurring in the interior space of the ancillary reaction chamber being provided by residual heat corresponding to the gases output by the plasma chamber.

16. A method, comprising:

obtaining, by an ancillary reaction chamber, an ancillary reaction chamber inlet flow formed from one or more gases output by a plasma chamber and one or more gas flows;

affecting a chemical reaction between the ancillary reaction chamber inlet flow using residual heat from a plasma generated in the plasma chamber and an oxidizer gas that is provided directly to the ancillary reaction chamber; and outputting one or more product gases yielded by the chemical reaction.

17. The method of claim 16, wherein the chemical reaction includes at least one of: a natural gas reformation reaction, a hydrocarbon generation reaction, a partial oxidation reaction, and a combustion reaction.

18. The method of claim 16, wherein the product gases yielded by the chemical reaction are directed towards one or more ancillary reactor units for processing of the product gases.

19. The method of claim 16, wherein obtaining, by the ancillary reaction chamber, the gases output by the plasma chamber includes mixing the gases with one or more residual gases and obtaining a mixture of the gases output by the plasma chamber and the residual gases, the residual gases including at least one of: unreacted reactant gases from the plasma chamber, a waste gas, or an oxidizer gas.

20. The method of claim 16, further comprising:

obtaining, by a second ancillary reaction chamber connected to the ancillary reaction chamber, the product gases yielded by the chemical reaction;

affecting a second chemical reaction between the product gases using residual heat from the ancillary reaction chamber and the plasma generated in the plasma chamber; and outputting one or more second product gases yielded by the second chemical reaction.

* * * * *